US012361272B2

(12) United States Patent
Yakopcic et al.

(10) Patent No.: US 12,361,272 B2
(45) Date of Patent: *Jul. 15, 2025

(54) ANALOG NEUROMORPHIC CIRCUIT IMPLEMENTED USING RESISTIVE MEMORIES

(71) Applicant: University of Dayton, Dayton, OH (US)

(72) Inventors: Chris Yakopcic, Dayton, OH (US); Md Raqibul Hasan, Baltimore, MD (US); Tarek M. Taha, Centerville, OH (US)

(73) Assignee: UNIVERSITY OF DAYTON, Dayton, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/442,496

(22) Filed: Feb. 15, 2024

(65) Prior Publication Data

US 2024/0185050 A1 Jun. 6, 2024

Related U.S. Application Data

(63) Continuation of application No. 18/075,950, filed on Dec. 6, 2022, now Pat. No. 11,907,831, which is a (Continued)

(51) Int. Cl.
*G11C 11/00* (2006.01)
*G06N 3/065* (2023.01)
(Continued)

(52) U.S. Cl.
CPC .............. *G06N 3/065* (2023.01); *G11C 11/54* (2013.01); *G11C 13/0002* (2013.01)

(58) Field of Classification Search
CPC .. G11C 13/0021; G11C 13/004; G06N 3/065; G06N 3/045; G06N 3/08; G06F 17/10
See application file for complete search history.

(56) References Cited

U.S. PATENT DOCUMENTS 5,530,393 A 6/1996 Guerrieri et al.
5,592,418 A 1/1997 Sabatini et al.
(Continued)

OTHER PUBLICATIONS

Chabi et al., "Robust Neural Logic Block (NLB) Based on Memristor Crossbar Array" IEEE/ACM International Symposium on Nanoscale Architectures, pp. 137-143, 2011.
(Continued)

*Primary Examiner* — Hien N Nguyen
(74) *Attorney, Agent, or Firm* — Taft Stettinius & Hollister LLP

(57) ABSTRACT

An analog neuromorphic circuit is disclosed, having input voltages applied to a plurality of inputs of the analog neuromorphic circuit. The circuit also includes a plurality of resistive memories that provide a resistance to each input voltage applied to each of the inputs so that each input voltage is multiplied in parallel by the corresponding resistance of each corresponding resistive memory to generate a corresponding current for each input voltage and each corresponding current is added in parallel. The circuit also includes at least one output signal that is generated from each of the input voltages multiplied in parallel with each of the corresponding currents for each of the input voltages added in parallel. The multiplying of each input voltage with each corresponding resistance is executed simultaneously with adding each corresponding current for each input voltage.

12 Claims, 4 Drawing Sheets

Related U.S. Application Data continuation of application No. 17/362,272, filed on Jun. 29, 2021, now Pat. No. 11,521,054, which is a continuation of application No. 16/889,177, filed on Jun. 1, 2020, now Pat. No. 11,049,003, which is a continuation of application No. 16/679,800, filed on Nov. 11, 2019, now Pat. No. 10,671,914, which is a continuation of application No. 15/082,537, filed on Mar. 28, 2016, now Pat. No. 10,474,948.

(60) Provisional application No. 62/139,350, filed on Mar. 27, 2015.

(51) Int. Cl.
*G11C 11/54* (2006.01)
*G11C 13/00* (2006.01)

(56) References Cited

U.S. PATENT DOCUMENTS

| | | | |
|---|---|---|---|
| 7,398,259 | B2 | 7/2008 | Nugent |
| 8,274,312 | B2 | 9/2012 | Pino et al. |
| 8,954,363 | B2 | 2/2015 | Heliot et al. |
| 9,412,940 | B2 | 8/2016 | Sacchetto et al. |
| 10,474,948 | B2 | 11/2019 | Yakopcic et al. |
| 10,671,914 | B2 | 6/2020 | Yakopcic et al. |
| 11,049,003 | B2 * | 6/2021 | Yakopcic ............... G06N 3/065 |
| 11,521,054 | B2 | 12/2022 | Yakopcic et al. |
| 11,954,588 | B2 * | 4/2024 | Yakopcic ............... G06F 17/10 |
| 2011/0004579 | A1 | 1/2011 | Snider |
| 2012/0084241 | A1 | 4/2012 | Friedman et al. |
| 2012/0317063 | A1 | 12/2012 | Sim et al. |
| 2013/0103626 | A1 | 4/2013 | Hunzinger |
| 2013/0117213 | A1 | 5/2013 | Hunzinger et al. |
| 2013/0311413 | A1 | 11/2013 | Rose et al. |
| 2013/0325775 | A1 | 12/2013 | Sinyavskiy et al. |
| 2014/0052679 | A1 | 2/2014 | Sinyavskiy et al. |
| 2014/0122402 | A1 | 5/2014 | Bichler et al. |
| 2014/0129498 | A1 | 5/2014 | Bichler et al. |
| 2016/0336064 | A1 | 11/2016 | Seo et al. |
| 2021/0326689 | A1 * | 10/2021 | Yakopcic ............... G11C 11/54 |
| 2023/0095626 | A1 | 3/2023 | Yakopcic et al. |
| 2024/0256847 | A1 * | 8/2024 | Yakopcic ............... G06N 3/045 |

OTHER PUBLICATIONS

Zamarreno-Ramos et al., "On spike-timing-dependent-plasticity, memristive devices, and building a self-learning visual cortex," Frontiers in Neuroscience, Neuromorphic Engineering, vol. 5, pp. 1-22, Article 26, Mar. 2011.

Jo et al., "High-Density Crossbar Arrays Based on a Si Memristive System" Nano Letters, 9(2), 2009, pp. 870-874.

Alibart et al., "Pattern classification by memristive crossbar circuits with ex-situ and in-situ training", Nature Communications, 4:2072, Jun. 2013.

Taha et al., "Neuromorphic algorithms on clusters of PlayStation 3s," International Joint Conference on Neural Networks (IJCNN), pp. 1-10, Jul. 18-23, 2010.

Dubey, "Recognition, mining and synthesis moves computers to the era of tera," Technology@Intel Magazine, Feb. 2005.

Esmaeilzadeh et al., "Neural Acceleration for General-Purpose Approximate Programs," International Symposium on Microarchitecture (MICRO), 2012.

Esmaeilzadeh et al., "Towards Neural Acceleration for General-Purpose Approximate Computing," Workshop on Energy Efficient Design (WEED), 2012.

Chua, "Memristor—The Missing Circuit Element," IEEE Transactions on Circuit Theory, 18(5), 507-519 (1971).

Strukov et al., "The missing Memristor found," Nature, 453, 80-83 (2008).

Snider, "Cortical Computing with Memristive Nanodevices," SciDAC Review, 58 (2008).

Nageswaran et al., "Efficient Simulation of Large-Scale Spiking Neural Networks Using CUDA Graphics Processors," In Proceedings of 2009 International Joint Conference on Neural Networks (IJCNN). IEEE Press, Piscataway, NJ, USA, pp. 3201-3208, 2009.

Han et al., "Accelaration of spiking neural network based pattern recognition on NVIDIA graphics processors," Journal of Applied Optics, 49(101), pp. 83-91, 2010.

Truong et al., "New Memristor-Based Crossbar Array Architecture with 50-% Area Reduction and 48-% Power Saving for Matrix-Vector Multiplication of Analog Neuromorphic Computing," Journal of Semiconductor Technology and Science, 14(3), pp. 356-363, 2014.

* cited by examiner

```
                                    500
                                        ↘
                ┌─────────────────────────────────────────┐
                │  APPLY A PLURALITY OF INPUT VOLTAGES TO A│
         510─── │  PLURALITY OF INPUTS OF AN ANALOG        │
                │  NEUROMORPHIC CIRCUIT.                   │
                └─────────────────────────────────────────┘
                                    │
                                    ▼
                ┌─────────────────────────────────────────┐
                │  PROVIDE A RESISTANCE TO EACH INPUT      │
                │  VOLTAGE APPLIED TO EACH OF THE INPUTS   │
                │  SO THAT EACH INPUT VOLTAGE IS MULTIPLIED│
                │  IN PARALLEL BY THE CORRESPONDING        │
         520─── │  RESISTIVE MEMORY TO GENERATE A          │
                │  CORRESPONDING CURRENT FOR EACH INPUT    │
                │  VOLTAGE AND EACH CORRESPONDING          │
                │  CURRENT IS ADDED IN PARALLEL.           │
                └─────────────────────────────────────────┘
                                    │
                                    ▼
                ┌─────────────────────────────────────────┐
                │  GENERATE AT LEAST ONE OUTPUT SIGNAL FROM│
                │  EACH OF THE INPUT VOLTAGES MULTIPLIED IN│
                │  PARALLEL WITH EACH OF THE CORRESPONDING │
         530─── │  CURRENTS FOR EACH OF THE INPUT VOLTAGES │
                │  ADDED IN PARALLEL WHERE MULTIPLYING EACH│
                │  INPUT VOLTAGE WITH EACH CORRESPONDING   │
                │  CURRENT IS EXECUTED SIMULTANEOUSLY WITH │
                │  ADDING EACH CORRESPONDING CURRENT FOR   │
                │  EACH INPUT VOLTAGE.                     │
                └─────────────────────────────────────────┘
```

FIG. 5

ANALOG NEUROMORPHIC CIRCUIT IMPLEMENTED USING RESISTIVE MEMORIES

RELATED APPLICATIONS

The present application is a continuation of U.S. Nonprovisional application Ser. No. 18/075,950 filed Dec. 6, 2022, which is a continuation of U.S. Nonprovisional application Ser. No. 17/362,272 filed Jun. 29, 2021 and is now U.S. Pat. No. 11,521,054, which is a continuation of U.S. Nonprovisional application Ser. No. 16/889,177 filed Jun. 1, 2020 and is now U.S. Pat. No. 11,521,054, which is a continuation of U.S. Nonprovisional application Ser. No. 16/679,800 filed Nov. 11, 2019 and is now U.S. Pat. No. 10,671,914, which is a continuation of U.S. Nonprovisional application Ser. No. 15/082,537 filed Mar. 28, 2016 and is now U.S. Pat. No. 10,474,948, which claims the benefit of and priority to U.S. Provisional Application Ser. No. 62/139,350 filed Mar. 27, 2015, the disclosure of which are incorporated by reference in their entirety.

FIELD OF THE INVENTION

This invention relates to neural networks, and more particularly, to systems and methods for implementing resistive memories in an analog neuromorphic circuit.

BACKGROUND OF THE INVENTION

Traditional computing systems use conventional microprocessor technology in that operations are performed in chronological order such that each operation is completed before the subsequent operation is initiated. The operations are not performed simultaneously. For example, an addition operation is completed before the subsequent multiplication operation is initiated. The chronological order of operation execution limits the performance of conventional microprocessor technology. Conventional microprocessor design is limited in how small the microprocessors can be designed, the amount of power that the microprocessors consume, as well as the speed in which the microprocessors execute operations in chronological order. Thus, conventional microprocessor technology is proving insufficient in applications that require significant computational efficiency, such as in image recognition.

It is becoming common wisdom to use conventional neuromorphic computing networks which are laid out in a similar fashion as the human brain. Hubs of computing power are designed to function as a neuron in the human brain where different layers of neurons are coupled to other layers of neurons. This coupling of neurons enables the neuromorphic computing network to execute multiple operations simultaneously. Therefore, the neuromorphic computing network has exponentially more computational efficiency than traditional computing systems.

Conventional neuromorphic computing networks are implemented in large scale computer clusters which include computers that are physically large in order to attain the computational efficiency necessary to execute applications such as image recognition. For example, applications of these large scale computer clusters include rows and rows of physically large servers that may attain the computational efficiency necessary to execute image recognition when coupled together to form a conventional neuromorphic computing network. Such large scale computer clusters not only take up a significant amount of physical space but also require significant amounts of power to operate.

The significant amount of physical space and power required to operate conventional neuromorphic computing networks severely limits the types of applications for which conventional neuromorphic computing networks may be implemented. For example, industries such as biomedical, military, robotics, and mobile devices are industries that cannot implement conventional neuromorphic computing networks due to the significant space limitations in such industries as well as the power limitations. Therefore, an effective means to decrease the space and the power required by conventional neuromorphic computing is needed.

SUMMARY OF THE INVENTION

The present invention provides an analog neuromorphic circuit that implements a plurality of resistive memories, including a plurality of input voltages, and at least one output signal. The plurality of input voltages is applied to a plurality of inputs of the analog neuromorphic circuit. The plurality of resistive memories is configured to provide a resistance to each input voltage applied to each of the inputs so that each input voltage is multiplied in parallel by the corresponding resistance of each corresponding resistive memory to generate a corresponding current for each input voltage and each corresponding current is added in parallel. At least one output signal is generated from each of the input voltages multiplied in parallel with each of the corresponding currents for each of the input voltages added in parallel. Multiplying each input voltage with each corresponding resistance is executed simultaneously with adding each corresponding current for each input voltage.

The present invention also provides a method for generating computer operations in parallel by implementing a plurality of resistive memories. The method starts with applying a plurality of input voltages to a plurality of inputs of an analog neuromorphic circuit. The method further includes providing, by a plurality of resistive memories, a resistance to each input voltage applied to each of the inputs so that each input voltage is multiplied in parallel by the corresponding resistance of each corresponding resistive memory to generate a corresponding current for each input voltage and each corresponding current is added in parallel. The method further includes generating at least one output signal from each of the input voltages multiplied in parallel with each of the corresponding currents for each of the input voltages added in parallel. Multiplying each input voltage with each corresponding resistance is executed simultaneously with adding each corresponding current for each input voltage.

The present invention also provides an analog neuromorphic system that implements a plurality of resistive memories, including a first plurality of wires, and a second plurality of wires. The first plurality of wires is positioned to intersect with a second plurality of wires forming a first wire grid. Each resistive memory is positioned at an intersection of the first plurality of wires and the second plurality of wires. The plurality of resistive memories is configured to provide a resistance to each input voltage applied to each of the first plurality of wires so that each input voltage of the first wire grid is multiplied in parallel by the corresponding resistance to generate a corresponding current for each input voltage and each corresponding current is added in parallel. At least one output signal is generated from each of the input voltages multiplied in parallel with each of the corresponding currents for each of the input voltages added in parallel.

Multiplying each input voltage with each corresponding resistance is executed simultaneously with adding each corresponding current for each input voltage.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

FIG. 5 is a flowchart of exemplary operational steps of an analog neuromorphic circuit according to an exemplary embodiment of the present disclosure.

DETAILED DESCRIPTION

Figure 1:
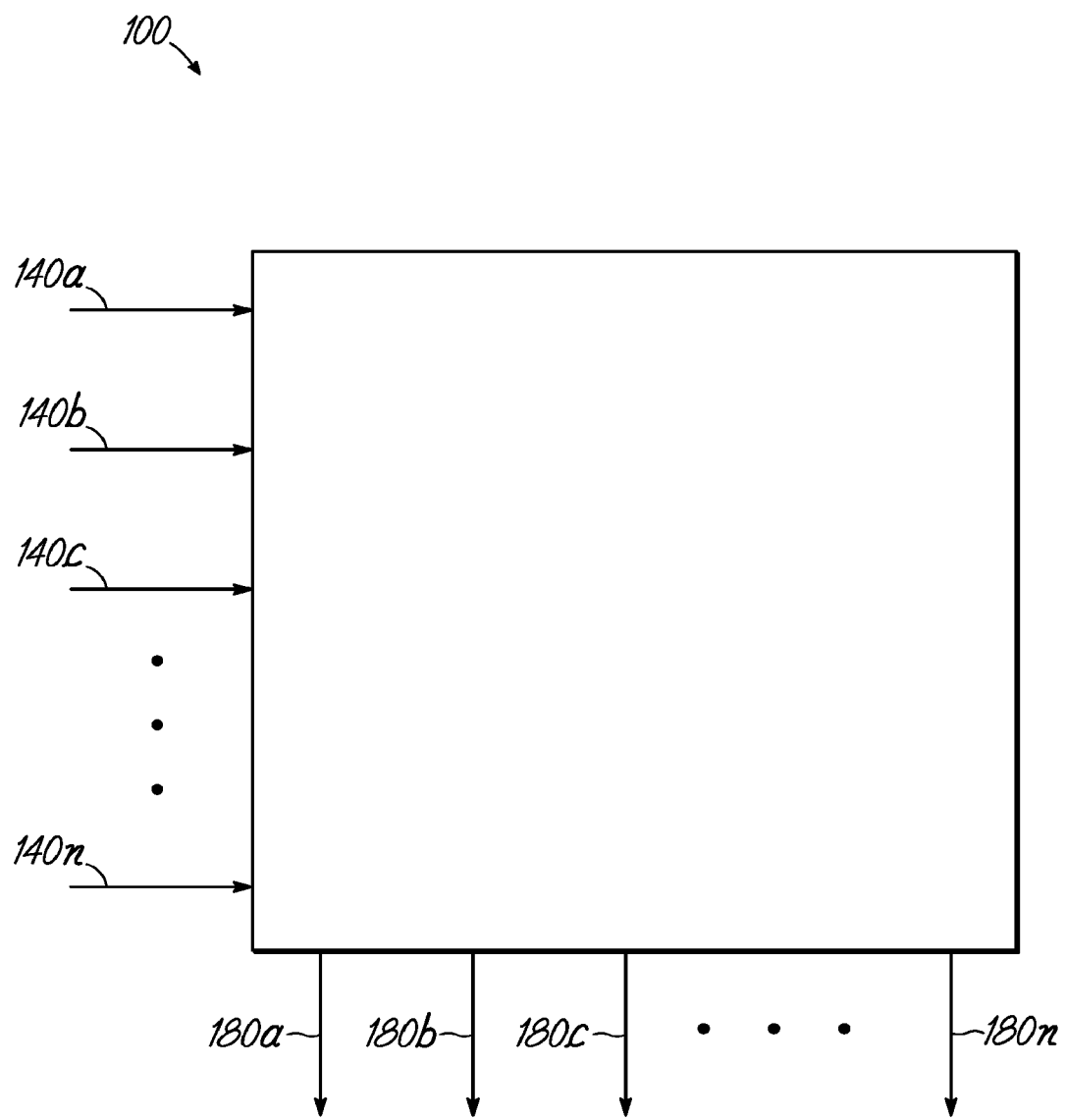
FIG. 1 is a schematic illustration of an exemplary analog neuromorphic processing device that simultaneously executes several computing operations in parallel in accordance with an embodiment of the disclosure.

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

The present invention creates an analog neuromorphic computing network by implementing resistive memories. A resistive memory is a non-volatile, variable resistor that may not only change the resistance level but may also maintain the resistance level after power to the resistive memory has been terminated so that the resistive memory acts as memory. A combination of resistive memories may generate output values that may be positive and/or negative. Such characteristics of the resistive memory enables neuromorphic computing to be shrunk down from implementing large computers to a circuit that can be fabricated onto a chip while requiring minimal power due to the analog characteristics of the resistive memory.

The resistive memories may be positioned in a crossbar configuration in that each resistive memory is positioned at an intersection of a plurality of horizontal wires and a plurality of vertical wires forming a wire grid. An input voltage may be applied to each horizontal wire. Each resistive memory may apply a resistance to each input voltage so that each input voltage is multiplied by each resistance. The positioning of each resistive memory at each intersection of the wire grid enables the multiplying of each input voltage by the resistance of each resistive memory to be done in parallel. The multiplication in parallel enables multiple multiplication operations to be executed simultaneously. Each current relative to each horizontal wire may then be added to generate an accumulative current that is conducted by each vertical wire. The addition of each current to generate the accumulative currents is also done in parallel due to the positioning of the resistive memories at each intersection of the wire grid. The addition in parallel also enables multiple addition operations to be executed simultaneously. The simultaneous execution of addition and multiplication operations in an analog circuit generates significantly more computational efficiency than conventional microprocessors while implementing significantly less power than conventional microprocessors.

The terms "horizontal" and "vertical" are used herein for ease of discussion to refer to one example of the invention. It should be understood however that such orientation is not required, nor is a perpendicular intersection required. It is sufficient that a plurality of parallel wires intersects a pair of parallel wires to form a crossbar or grid pattern having two wires for adding current and two or more wires for inputting voltages, with a resistive memory positioned at each intersection for multiplication. The intersections may occur at rights angles (orthogonal crossing lines) or non-right angles. It may be understood, however, that the orthogonal arrangement provides the simplest means for scaling the circuit to include additional neurons and/or layers of neurons. Further, it may be understood than an orientation having horizontal rows and/or vertical columns is also simpler for scaling purposes and is a matter of the point of reference, and should not be considered limiting. Thus, any grid configuration orientation is contemplated.

Referring to FIG. 1, an analog neuromorphic processing device 100 simultaneously executes several computing operations in parallel. The analog neuromorphic processing device 100 includes a plurality of input voltages 140(*a-n*) that are applied to a plurality of respective inputs of the analog neuromorphic processing device 100 and the analog neuromorphic processing device 100 then generates a plurality of output signals 180(*a-n*).

The analog neuromorphic processing device 100 may include a plurality of resistive memories (not shown) that have variable resistance characteristics that may be exercised not only with low levels of power but may also exercise those variable resistance characteristics after power applied to the resistive memories has been terminated. The variable resistance characteristics of the resistive memories enable the resistive memories to act as memory while maintaining significantly low power requirements compared to conventional microprocessors. The resistive memories are also of nano-scale sizes that enable a significant amount of resistive memories to be configured within the analog neuromorphic processing device 100 while still maintaining significantly low power level requirements. The variable resistance capabilities of the resistive memories coupled with the nano-scale size of the resistive memories enable the resistive memories to be configured so that the analog neuromorphic processing device 100 has significant computational efficiency while maintaining the size of the analog neuromorphic processing device 100 to a chip that may easily be positioned on a circuit board.

For example, the resistive memories may include but are not limited to memristors that are nano-scale variable resistance devices with a significantly large variable resistance range. The physics of the resistive memories, such as memristors, require significantly low power and occupy little space so that the resistive memories may be configured in the analog neuromorphic processing device 100 to generate significant computational efficiency from a small chip.

The plurality of input voltages 140(*a-n*), where n is an integer greater than or equal to one, may be applied to corresponding inputs of the analog neuromorphic processing device 100 to exercise the variable resistance characteristics of the resistive memories. The input voltages 140(*a-n*) may be applied at a voltage level and for a time period that is sufficient to exercise the variable resistance characteristics of the resistive memories. The input voltages 140(*a-n*) may vary and/or be substantially similar depending on the types of variable resistance characteristics that are to be exercised by each of the resistive memories.

The resistive memories may be arranged in the analog neuromorphic processing device 100 such that the resistive memories may simultaneously execute multiple addition and multiplication operations in parallel in response to the input voltages 140(*a-n*) being applied to the inputs of the analog neuromorphic processing device 100. The variable resistance characteristics of the resistive memories as well as their nano-scale size enables a significant amount resistive memories to be arranged so that the input voltages 140(*a-n*) trigger responses in the resistive memories that are then propagated throughout the analog neuromorphic processing device 100 that results in simultaneous multiplication and addition operations that are executed in parallel.

The simultaneous multiplication and addition operations executed in parallel exponentially increases the efficiency of analog neuromorphic processing device 100 while limiting the power required to obtain such computation capabilities to the input voltages 140(*a-n*). The resistive memories are passive devices so that the simultaneous multiplication and addition operations executed in parallel are performed in the analog domain, which also exponentially decreases the required power. For example, the analog neuromorphic processing device 100 may have significantly more computational efficiency than traditional microprocessor devices, and may be smaller than traditional microprocessor chips while reducing power in a range from 1,000 times to 1,000,000 times that of traditional microprocessors.

The resistive memories may also be arranged such that the simultaneous execution of the multiplication and addition operations in parallel may be configured as a single computation hub that constitutes a single neuron in a neural network. The variable resistance characteristics and the nano-scale size of the resistive memories further enable the arrangement of resistive memories to be scaled with other arrangements of resistive memories so that the single neuron may be scaled into a neural network including multiple neurons. The scaling of a single neuron into multiple neurons exponentially further increases the computational efficiency of the resulting neural network. In addition, the multiple neurons may be scaled into several layers of neurons that further exponentially increases the computational efficiency of the neural network. The scaling of the resistive memories into additional neurons may be done within the analog neuromorphic processing device 100 such as within a single chip. However, the analog neuromorphic processing device 100 may also be scaled with other analog neuromorphic circuits contained in other chips to exponentially increase the computational efficiency of the resulting neural network.

As a result, the analog neuromorphic processing device 100 may be configured into a neural network that has the capability of executing applications with significant computational efficiency, such as image recognition. For example, the output signals 180(*a-n*), where n is an integer greater than or equal to one, may generate signals that correctly identify an image. The analog neuromorphic processing device 100 may also have the learning capability as will be discussed in further detail below so that analog neuromorphic circuits may successfully execute learning algorithms.

The analog neuromorphic processing device 100 implemented as a single neuron and/or multiple neurons in a neural network and/or configured with other similar analog neuromorphic processing device 100 may have significant advantages in traditional computing platforms that require significant computational efficiency with limited power resources and space resources. For example, such traditional computing platforms may include but are not limited to Fast Fourier Transform (FFT) applications, Joint Photographic Experts Group (JPEG) image applications, and/or root mean square (RMS) applications. The implementation of low power neural networks that have a limited physical footprint may also enable this type of computational efficiency to be utilized in many systems that have traditionally not been able to experience such computational efficiency due to the high power consumption and large physical footprint of conventional computing systems. Such systems may include but are not limited to military and civilian applications in security (image recognition), robotics (navigation and environment recognition), and/or medical applications (artificial limbs and portable electronics).

The layering of the analog neuromorphic processing device 100 with other similar analog neuromorphic circuits may enable complex computations to be executed. The compactness of the resistive memory configurations enables fabrication of chips with a high synaptic density in that each chip may have an increased amount of neurons that are fitted onto the chip. The passive characteristics of the resistive memories eliminate the need for software code which increases the security of the analog neuromorphic processing device 100.

Figure 2:
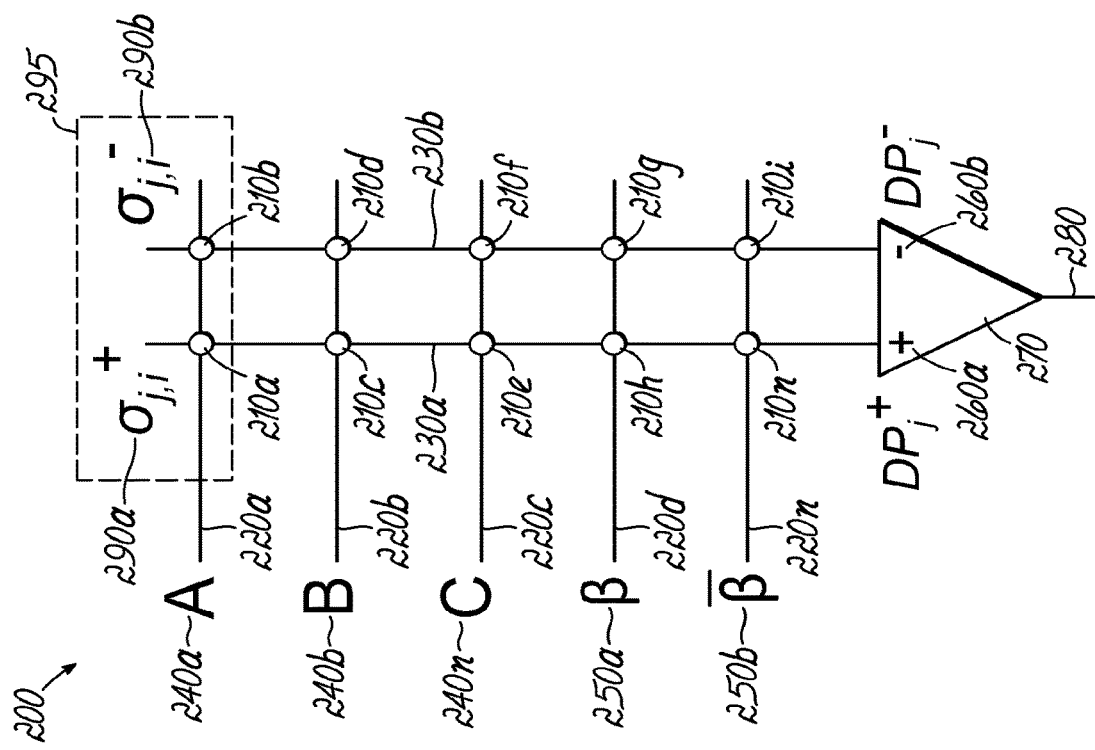
FIG. 2 is a schematic illustration of an exemplary analog neuromorphic circuit that simultaneously executes several computing operations in parallel in accordance with an embodiment of the disclosure.

Referring to FIG. 2, an analog neuromorphic circuit 200 simultaneously executes several computing operations in parallel. The analog neuromorphic circuit 200 includes a plurality of resistive memories 210(a-n) where n is an integer equal to or greater than four, a plurality of horizontal wires 220(a-n) where n is an integer equal to or greater than two, a pair of vertical wires 230(a-b), a plurality of input voltages 240(a-n) where n is an integer equal to or greater than two, a pair of bias voltage connections 250(a-b), a first and second input of a comparator 260(a-b), a comparator 270, an output of the comparator 280, a pair of weights 290(a-b), and a combined weight 295. The analog neuromorphic circuit 200 shares many similar features with the analog neuromorphic processing device 100; therefore, only the differences between the analog neuromorphic circuit 200 and the analog neuromorphic processing device 100 are to be discussed in further detail.

The analog neuromorphic circuit 200 may be representative of a single neuron of a neural network. The analog neuromorphic circuit 200 has the capability to be scaled to interact with several other analog neuromorphic circuits so that multiple neurons may be implemented in the neural network as well as creating multiple layers of neurons in the neural network. Such a scaling capability to include not only multiple neurons but also multiple layers of neurons significantly magnifies the computational efficiency of the neural network, as will be discussed in further detail below.

The resistive memories 210(a-n) may be laid out in a crossbar configuration that includes a high density wire grid. The crossbar configuration enables the resistive memories 210(a-n) to be tightly packed together in the wire grid as will be discussed in further detail below. The tightly packed resistive memories 210(a-n) provides a high density of resistive memories 210(a-n) in a small surface area of a chip such that numerous analog neuromorphic circuits may be positioned in a neural network on a chip while occupying little space. The crossbar configuration also enables the resistive memories 210(a-n) to be positioned so that the analog neuromorphic circuit 200 may execute multiple addition and multiplication operations in parallel in the analog domain. The numerous neuromorphic circuits may then be positioned in the neural network so that the multiple addition and multiplication operations that are executed in parallel may be scaled significantly, thus exponentially increasing the computational efficiency. The resistive memories 210(a-n) are passive devices so that the multiple addition and multiplication operations executed in parallel are done in the analog domain, which also exponentially decreases the required power.

In an embodiment, the horizontal wires 220(a-n) may be positioned to intersect with the vertical wires 230(a-b) to form a wire grid. In an embodiment, the horizontal wires 220(a-n) may be positioned orthogonal to the vertical wires 230(a-b). Each of the resistive memories 210(a-n) may be positioned at an intersection of the wire grid. For example resistive memory 210a is positioned at the intersection of horizontal wire 220a and the vertical wire 230a; the resistive memory 210b is positioned at the intersection of horizontal wire 220b and the vertical wire 230b and so on. The positioning of the horizontal wires 220(a-n) and the vertical wires 230(a-b) to form a wire grid and the positioning of each of the resistive memories 210(a-n) at each intersection of the wire grid may form the crossbar configuration.

Input voltages 240(a-n) may be applied to each of the respective horizontal wires 220(a-c). In FIG. 1, the input voltage 240a is represented by "A", the input voltage 240b is represented by "B", and the input voltage 240n is represented by "C". For example, the input voltage 240a may be applied to the horizontal wire 220a, the input voltage 240b may be applied to the horizontal wire 220b, and the input voltage 240c may be applied to the horizontal wire 220c. As each of the input voltages 240(a-n) is applied to each of the respective horizontal wires 220(a-c), the resistance of each of the respective resistive memories 210(a-f) is multiplied with each of the respective input voltages 240(a-n) to generate a current that is then conducted by each of the respective vertical wires 230(a-b). The crossbar configuration then enables the multiplication of each of the respective input voltages 240(a-n) with the resistance of each of the resistive memories 210(a-f) in parallel so that each of the multiplications is executed simultaneously. The execution of multiple multiplication operations in parallel results in significant computational efficiency as compared to traditional microprocessors that execute each multiplication operation in a chronological order in that the current multiplication operation is completed before the subsequent multiplication operation is executed.

For example, the input voltage 240a is applied to the horizontal wire 220a. The resistance of the resistive memory 210a is multiplied with the input voltage 240a to generate a current that is then conducted by the vertical wire 130a that intersects the horizontal wire 220a at the resistive memory 210a. The resistance of the resistive memory 210b is multiplied with the input voltage 240a to generate a current that is then conducted by the vertical wire 230b that intersects the horizontal wire 220a at the resistive memory 210b. The crossbar configuration then enables the input voltage 240a to not only be multiplied by the resistance of the resistive memory 210a to generate the current conducted by the vertical wire 230a but also the multiplication of the input voltage 140a by the resistance of the resistive memory 210b in parallel to generate current conducted by the vertical wire 230b. The multiplication of the input voltages 240b to 240n happens in a similar fashion simultaneously with the multiplication of the input voltage 240a.

As each of the currents relative to each of the horizontal wires 220(a-c) are conducted by each of the vertical wires 230(a-b), those currents are then added to generate accumulative currents that are conducted by each of the respective vertical wires 230(a-b). For example and as noted above, the application of the input voltage 240a to the horizontal wire 220a is multiplied by the resistance of the resistive memory 210a to generate a current that is then conducted by the vertical wire 230a. The application of the input voltage 240b to the horizontal wire 220b is multiplied by the resistance of the resistive memory 210c to generate a current that is also conducted by the vertical wire 230a. The current generated from the input voltage 240a being applied to the horizontal wire 220a is then added to the current generated from the input voltage 240b being applied to the horizontal wire 220b. The addition of the current generated from the input voltage 240n being applied to the horizontal wire 220c that is multiplied by the resistance of the resistive memory 210e is also added to the currents generated by the input voltage 240a being applied to the horizontal wire 220a and the input voltage 240b being applied to the horizontal wire 220b to generate an accumulative current.

The adding of currents conducted by the vertical wire 230b is also done in a similar manner. The crossbar configuration enables the adding of the currents conducted by the vertical wire 230a to be done in parallel with the adding of the currents conducted by the vertical wire 230b so that the addition operations are done simultaneously. The crossbar configuration also enables the adding of the currents to be done simultaneously with the multiplication of each of the input voltages 240(a-n) with the resistance of each of the respective resistive memories 210(a-f). The simultaneous execution of multiple addition operations as well as multiple multiplication operations results in significant computational efficiency as compared to traditional microprocessors that execute each multiplication operation and then each addition operation in a chronological order in that the current multiplication operation is completed before the subsequent addition operation is executed.

As noted above, the accumulated currents conducted by the vertical wires 230(a-b) may be representative of the adding of each of the currents generated by the applying of each of the input voltages 240(a-n) to each of the respective horizontal wires 220(a-c). Each of the vertical wires 230(a-b) may then be coupled to bias connections 250(a-b). In FIG. 2, the bias connections 250(a-b) are represented by p and p (bar). Each of the bias connections 250(a-b) may be positioned between a last horizontal wire that has an input voltage applied and the first and second inputs 260(a-b) of the comparator 270. For example, the bias connections 250(a-b) may be positioned between the horizontal wire 220c that is the last horizontal wire having an input voltage 240n being applied. Such a positioning of the bias connections 250(a-b) enables the accumulative currents being conducted on the vertical wires 230(a-b) to be converted to voltage values so that the comparator 170 may compare the voltage values associated with each of the accumulative currents. The voltage values may be representative of the sum of each of the currents added together to form each of the accumulative currents as discussed above.

The first input 260a of the comparator 270 may be coupled to the vertical wire 230a and the second input 260b of the comparator 270 may be coupled to the vertical wire 230b. The comparator 270 may then compare the voltage value of the accumulative current conducted by the vertical wire 230a to the voltage value of the accumulative current conducted by the vertical wire 230b. The comparator 270 may then generate an output signal 280 that is representative of the comparison of the voltage value of the accumulative current conducted by the vertical wire 230a and the voltage value of the accumulative current conducted by the vertical wire 230b. The comparator 270 may generate a first output signal 280 when the voltage value of the accumulative current conducted by the vertical wire 230a is greater than the voltage value of the accumulative current conducted by the vertical wire 230b. The comparator 270 may generate a second output signal 280 when the voltage value of the accumulative current conducted by the vertical wire 230b is greater than the voltage value of the accumulative current conducted by the vertical wire 230a.

For example, the comparator 270 generates a high voltage signal that is representative of the binary signal "1" when the voltage value of the accumulative current conducted by the vertical wire 230a is greater than the voltage value of the accumulative current conducted by the vertical wire 230b. The comparator 270 generates a low voltage signal that is representative of the binary signal "0" when the voltage value of the accumulative current conducted by the vertical wire 230b is greater than the voltage value of the accumulative current conducted by the vertical wire 230a. In an embodiment, the comparator 270 may compare the dot product (DP/) of the voltage value of the accumulative current conducted by the vertical wire 230a with the dot product (DPj) of the voltage value of the accumulative current conducted by the vertical wire 230b.

In an embodiment, the multiplication executed by the analog neuromorphic circuit 200 may be actual multiplication. However, in another embodiment, the multiplication executed by the analog neuromorphic circuit 200 may be an approximate multiplication in which the multiplication is scaled by a constant value that is dependent on the conductance of the resistive memories 210(a-n). For example, the dot product (DP/) of the voltage value of the accumulative current conducted by the vertical wire 230a may be scaled based on the conductivity of the variable resistances 210a, 210c, and 210e that are positioned on the first vertical wire 230a. The multiplication operations of the analog neuromorphic circuit 200 may be actual multiplication and/or approximate multiplication that are derived based on any type of scaling technique that that will be apparent to those skilled in the relevant art(s) without departing from the scope of the present disclosure.

The functionality of the analog neuromorphic circuit 200 may be determined based on weights associated with each of the resistive memories 210(a-n). The analog neuromorphic circuit 200 may function as an "AND" gate, an "OR" gate, an "XOR" gate, and/or any other logic function. The type of logic function executed by the analog neuromorphic circuit 200 may be changed by adjusting the variable resistance of each of the resistive memories 210(a-n). As noted above, each of the resistive memories 210(a-n) has a resistance. However, each of the resistive memories 210(a-n) have a significant variance in resistance in that the resistance of each of the resistive memories 210(a-n) may be adjusted to a wide range of values so that when implemented in different combinations may output positive and/or negative values.

In an embodiment, the weights associated with a pair of resistive memories that are both positioned on the same horizontal wire may be incorporated into a single combined weight in order to account for the possible positive and negative values that different combinations of resistive memories may output. For example, the weight 290a as represented by Gj, / in FIG. 2 is associated with the resistive memory 210a. The weight 290b as represented by Gj, i- in FIG. 2 is associated with the resistive memory 210b. The weight 290a may be combined with the weight 290b to generate a combined weight 295 that is representative of the resistive memories 210a and 210b.

The adjusting of the resistance value of each of the resistive memories 210(a-n) then has an impact on each of the currents generated when each of the input voltages 240(a-n) is applied to each of the respective horizontal wires 220(a-c) which then has an impact on the accumulative currents conducted by the vertical wires 230(a-b). The output 280 of the comparator 270 is then adjusted based on the comparison of the voltages associated with each of the accumulative currents resulting in a change in functionality of the analog neuromorphic circuit 200.

Figure 3:
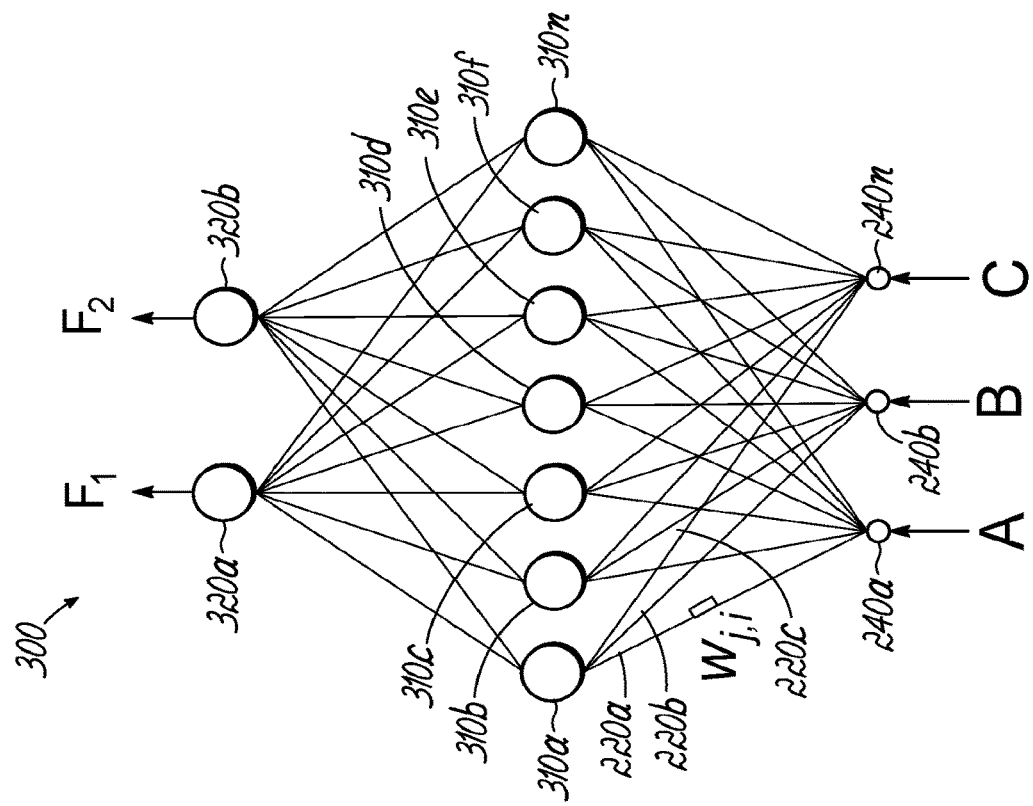
FIG. 3 is a schematic illustration of an exemplary neural network configuration that the analog neuromorphic circuit of FIG. 2 may be implemented and scaled in accordance with an embodiment of the disclosure.

Referring to FIG. 3, in which like reference numerals are used to refer to like parts, neural network configuration 300 that the analog neuromorphic circuit 200 may be implemented and scaled into is shown. The neural network configuration 300 shares many similar features with the analog neuromorphic processing device 100 and the analog neuromorphic circuit 200; therefore, only the differences between the neural network configuration 200 and the analog neuromorphic processing device 100 and the analog neuromorphic circuit 200 are to be discussed in further detail.

The analog neuromorphic circuit 200 may be implemented into the neural network configuration 300. The analog neuromorphic circuit 200 may constitute a single neuron, such as neuron 310a in the neural network configuration 300. As shown in FIG. 3, the input voltage 240a and represented by "A" is applied to the horizontal wire 220a, the input voltage 240b and represented by "B" is applied to the horizontal wire 220b, and the input voltage 240n and represented by "C" is applied to the horizontal wire 220c. The combined weight 295 as shown in FIG. 2 as representative of the combined weight for the input voltage 240a is shown as Wj,1 in FIG. 3. Similar combined weights for the input voltage 240b and the input voltage 240n may also be represented in FIG. 3 in a similar fashion. The wire grid, the resistive memories 210(a-n), and the comparator 270 are represented by the neuron 310a. The output 280 of the analog neuromorphic circuit 200 is coupled to additional neurons 320a and 320b.

The analog neuromorphic circuit 200 may then be scaled so that similar circuits may be configured with the analog neuromorphic circuit 200 to constitute additional neurons, such as neurons 310(b-n) where n is an integer greater than or equal to two. Each of the other neurons 310(b-n) includes similar circuit configurations as the analog neuromorphic circuit 200. However, the resistances of the resistive memories associated with each of the other neurons 310(b-n) may differ from the analog neuromorphic circuit 200 so that outputs that differ from the output 280 of the analog neuromorphic circuit 200 may be generated.

Rather than limiting the input voltages 240(a-n) to be applied to a single neuron 310, the input voltages 240(a-n) may also be applied to multiple other neurons 310(b-n) so that each of the additional neurons 310(b-n) also generate outputs that differ from the output 280 generated by the analog neuromorphic circuit 200. The generation of multiple different outputs from the different neurons 310(a-n) exponentially increases the computational efficiency of the neural network configuration 300. As noted above, the analog neuromorphic circuit 200 represented by the neuron 310a operates as a single logic function with the type of logic function being adjustable. The addition of neurons 310(b-n) provides additional logic functions that also have the capability of their logic functions being adjustable so that the computational efficiency of the neural network configuration 300 is significant.

In addition to having several different neurons 310(a-n), the analog neuromorphic circuit 200 may also be scaled to include additional layers of neurons, such as neurons 320 (a-b). The scaling of additional layers of neurons also exponentially increases the computational efficiency of the neural network configuration 300 to the extent that the neural network configuration 300 can execute learning algorithms. For example, a neural network configuration with a significant number of input voltages, such as several hundred, that are applied to a significant number of neurons, such as several hundred, that have outputs that are then applied to a significant number of layers of neurons, such as ten to twenty, may be able to execute learning algorithms. The repetitive execution of the learning algorithms by the extensive neural network configuration may result in the neural network configuration eventually attaining automatic image recognition capabilities.

For example, the neural network configuration may eventually output a high voltage value of "F1" representative of the binary signal "1" and output a low voltage value of "F/" representative of the binary signal "O" when the neural network configuration recognizes an image of a dog. The neural network configuration may then output a low voltage value of "F1" representative of the binary signal "O" and output a high voltage value of "F2" representative of the binary signal "1" when the neural network configuration recognizes an image that is not a dog.

Figure 4:
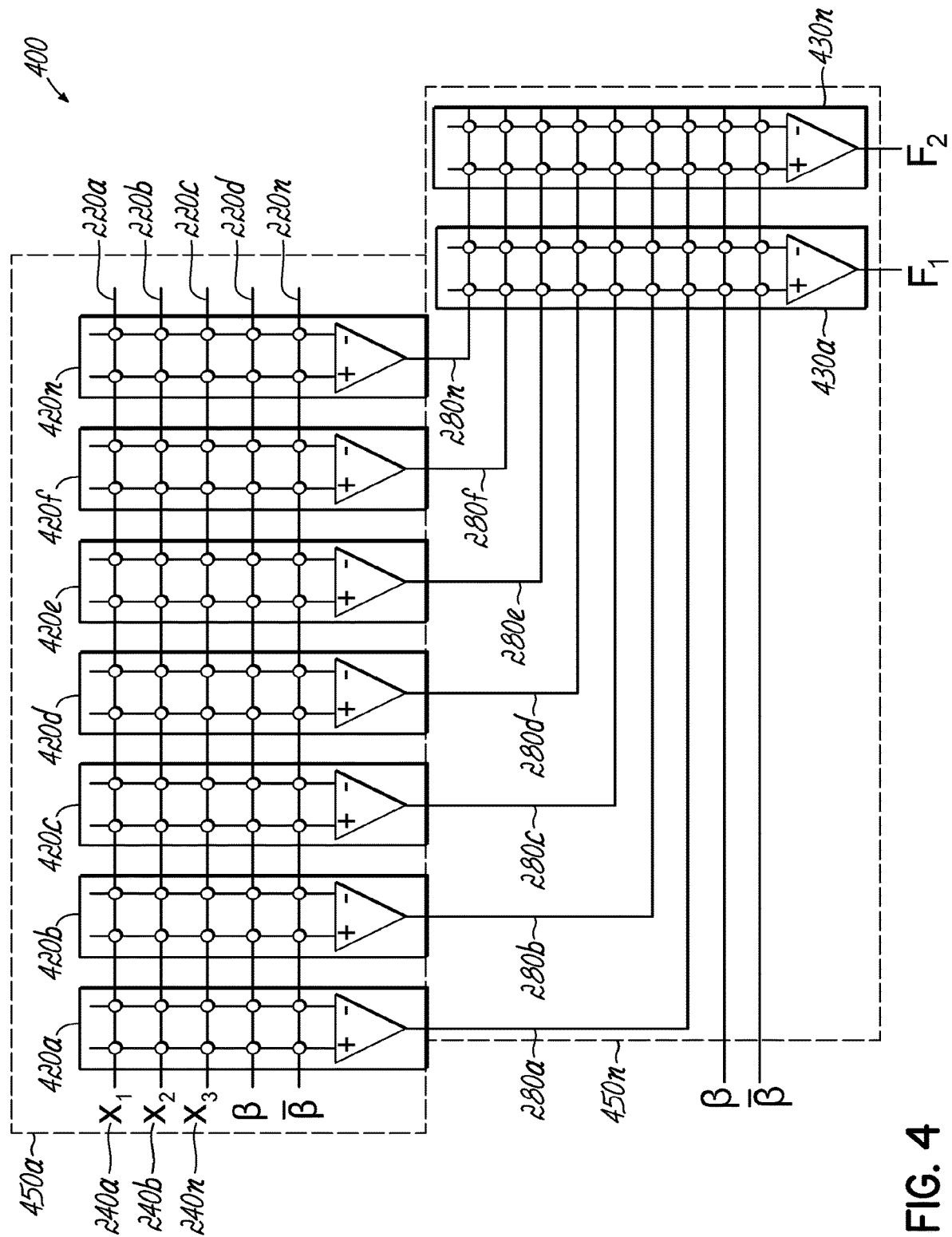
FIG. 4 is a schematic illustration of a detailed neural network configuration implementing analog neuromorphic circuits similar to the analog neuromorphic circuit of FIG. 2 in accordance with an embodiment of the disclosure.

Referring to FIG. 4, in which like reference numerals are used to refer to like parts, a detailed neural network configuration 400 implementing analog neuromorphic circuits similar to the analog neuromorphic circuit 200 is shown. The neural network configuration 400 shares many similar features with the analog neuromorphic processing device 100, the analog neuromorphic circuit 200, and the neural network configuration 300; therefore, only the differences between the neural network configuration 400 and the analog neuromorphic processing device 100, the analog neuromorphic circuit 200 and the neural network configuration 300 are to be discussed in further detail.

The network configuration 400 includes a plurality of neurons 420(a-n) that are positioned in a first layer of neurons 450a. The neuron 420a is similar to the analog neuromorphic circuit 200 discussed in detail in FIG. 2. Each additional neuron 420(b-n) are also similar to the neuromorphic circuit 200 except that the resistance of each of the resistive memories included in each neuron 420(b-n) differ from the neuron 420a as well as each other.

Specifically, each neuron 420(b-n) includes an additional pair of vertical wires that are positioned orthogonal relative to the horizontal wires 220(a-n) forming additional wire grids. Each neuron 420(b-n) includes resistive memories positioned at each intersection of the respective wire grids of each neuron 420(b-n) forming a crossbar configuration for each neuron 420(b-n). Because each of the vertical wires associated with each of the neurons 420(a-n) intersect each of the horizontal wires 220(a-c) forming the respective crossbar configurations in each of the neurons 420(*a-n*), the input voltages 240(*a-n*) not only drive the wire grid and the comparator of the neuron 420*a* but also each of the wire grids and comparators of each of the respective neurons 420(*b-n*). As a result, additional addition and multiplication operations may be executed for each neuron 420(*b-n*) in addition to the addition and multiplication operations of the neuron 420*a* without any additional input voltages having to be applied to the additional neurons 420(*b-n*).

For example, the input voltage 240*a* is applied to the horizontal wire 220*a*. The input voltage 240*a* is multiplied by the resistance of each of the resistive memories located at the intersection of the horizontal wire 220*a* and the vertical wires in the neuron 420*a* to generate currents that are conducted by the vertical wires of the neuron 420*a*. However, the input voltage 240*a* is also multiplied in parallel by the resistance of each of the resistance memories located in each of the additional neurons 420(*b-n*) generating additional currents conducted by each of the vertical wires of the respective neurons 420(*b-n*). Thus, the multiplication operations not only occur in the single neuron 420*a* but also occur in parallel in each of the other neurons 420(*b-n*) exponentially increasing the amount of simultaneous multiplication operations that are executed. Similar multiplication operations also are executed in parallel with respect to the input voltage 240*b* applied to the horizontal wire 220*b* and the input voltage 240*n* applied to the horizontal wire 220*c*.

As each of the currents relative to each of the horizontal wires 220(*a-c*) are conducted by each of the vertical wires of the neuron 420*a*, those currents are then added to generate accumulative currents that are conducted by each of the respective vertical wires of the neuron 420*a*. However, as each of the currents relative to each of the horizontal wires 220(*a-c*) are conducted by each of the vertical wires of each respective neuron 420(*b-n*), those currents are also added in parallel generating accumulative currents that are conducted by each of the respective vertical wires of the neurons 420(*b-n*). Thus, the addition operations not only occur in the single neuron 420*a* but also occur in parallel in each of the other neurons 420(*b-n*) as well as being executed simultaneously with each of multiplication operations executed by the neurons 420(*a-n*) exponentially increasing the amount of simultaneous addition and multiplication operations that are executed.

The analog neuromorphic circuit 200 may also be scaled to add additional layers, such as a second layer of neurons 450*n*, to the neural network configuration 400 as well as the addition of additional neurons 430(*a-n*). The second layer of neurons 450*n* includes neurons 430(*a-n*) where n is an integer greater than or equal to one. Each of the neurons 430(*a-n*) are also similar to the analog neuromorphic circuit 200 except that the resistance of each of the resistive memories included in each of the neurons 430(*a-n*) differ from the neurons 420(*a-n*) as well as each other.

Specifically, each neuron 430(*a-n*) includes an additional pair of vertical wires that are positioned orthogonally relative to outputs 280(*a-n*) forming additional wire grids. The outputs 280(*a-n*) are the outputs of each respective comparator of the neurons 420(*a-n*). As noted above, the outputs 280(*a-n*) of the neurons 420(*a-n*) are voltage signals that may be at a high voltage level representing the binary signal "1" or at a low voltage level representing the binary signal "0". Thus, each of the outputs 280(*a-n*) operate in a similar fashion as the input voltages 240(*a-n*). Each neuron 430(*a-n*) includes resistive memories positioned at each intersection of the respective grids of each of the neurons 430(*a-n*) forming a crossbar configuration for each of the neurons 430(*a-n*). Because of each of the vertical wires associated with each of the neurons 430(*a-n*) intersect each of the outputs 280(*a-n*) of the comparators of each of the respective neurons 420(*a-n*), the outputs 280(*a-n*) of the comparators of each of the respective neurons 420(*a-n*) drive each of the wire grids and comparators of each of the respective neurons 430(*a-n*). As a result, additional addition and multiplication operations may be executed for each neuron 430(*a-n*) in addition to the addition and multiplication operations of the neurons 420(*a-n*) without any additional input voltages having to be applied to the additional neurons 430(*a-n*).

For example, the output signal 280*n* is multiplied by the resistance of each of the resistive memories located at the intersection of the output signal 280*n* and the vertical wires in the neuron 430*a* to generate currents that are conducted by the vertical wires of the neuron 430*a*. However, the output signal 280*n* is also multiplied in parallel by the resistance of each of the resistance memories located in the neuron 430*n* generating an additional current conducted by the vertical wires of the neuron 430*n*. Thus, the multiplication operations not only occur in parallel in the second layer of neurons 450*n* but also occur in addition to the multiplication operations that occur in parallel in the first layer of neurons 450*a*. Similar multiplication operations are also executed in parallel with respect to the output signals 280(*a-f*).

As each of the currents relative to each of the output signals 280(*a-n*) are conducted by each of the vertical wires of the neuron 430*a*, those currents are then added to generate accumulative currents that are conducted by each of the respective vertical wires of the neuron 430*a*. However, as each of the currents relative to each of the output signals 280(*a-n*) are conducted by each of the vertical wires of the neuron 430*a*, those currents are added in parallel generating accumulative currents that are conducted by each of the respective vertical wires of the neuron 430*n*. Thus, the addition operations not only occur in parallel in the second layer of neurons 450*n* but also occur in addition to the multiplication operations that occur in parallel in the second layer of neurons 450*n*. The addition operations and the multiplication operations are not only executed simultaneously in the second layer of neurons 450*n* but also in addition to the addition operations and the multiplication operations that are executed simultaneously in the first layer of neurons 450*a* exponentially increasing the amount of simultaneous addition and multiplication operations that are executed collectively by the neural network configuration 400.

FIG. 5 is a flowchart of exemplary operational steps of an analog neuromorphic circuit according to an exemplary embodiment of the present disclosure. The present disclosure is not limited to this operational description. Rather, it will be apparent to persons skilled in the relevant art(s) from the teaching herein that other operational control flows are within the scope of the present disclosure. The following discussion describes the steps in FIG. 5.

At step 510, a plurality of input voltages is applied to a plurality of inputs of an analog neuromorphic circuit.

At step 520, a resistance is provided to each input voltage applied to each of the inputs so that each input voltage is multiplied in parallel by the corresponding resistive memory to generate a corresponding current for each input voltage and each corresponding current is added in parallel. For example, each input voltage 240(*a-n*) is applied to each corresponding input of an analog neuromorphic circuit, such as analog neuromorphic circuit 200. As each input voltage 240(a-n) is applied, resistances are generated by corresponding resistive memories 210(a-n) for each of the input voltages 240(a-n). Each of the input voltages 240(a-n) is multiplied by the resistances of the corresponding resistive memories 210(a-n) to generate a corresponding current for each of the input voltages 240(a-n). Each corresponding current is also added in parallel.

At step 530, at least one output signal is generated from each of the input voltages multiplied in parallel with each of the corresponding currents for each of the input voltages added in parallel. Multiplying each input voltage with each corresponding current is executed simultaneously with adding each corresponding current for each input voltage. For example, at least output signal 280 is generated from each of the input voltages 240(a-n) multiplied in parallel from the resistances applied by each of the corresponding resistive memories 210(a-n) as well as each of the corresponding currents for each of the input voltages 240(a-n) added in parallel.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. An analog neuromorphic system that implements a plurality of resistive memories, comprising:
   a first plurality of wires positioned to intersect a second plurality of wires forming a first wire grid;
   a first plurality of resistive memories with each resistive memory positioned at an intersection of the first plurality of wires and the second plurality of wires and configured to provide a resistance to each input voltage applied to each of the first plurality of wires so that each input voltage of the first wire grid is multiplied in parallel by the corresponding resistance to generate a corresponding current for each input voltage and each corresponding current is added in parallel; and
   at least one output signal that is generated from each of the input voltages multiplied in parallel with each of the corresponding currents for each of the input voltages added in parallel, wherein multiplying each input voltage with each corresponding resistance is executed simultaneously with adding each corresponding current for each input voltage.

2. The analog neuromorphic system of claim 1, further comprising:
   a first plurality of comparators with each comparator coupled to a pair of wires from the second plurality of wires at a first input and a second input of each component and configured to:
      compare a magnitude of each voltage that is associated with each respective current conducted by each respective pair or wires from the second plurality of vertical wires that are coupled to each respective first input and second input of each respective comparator, and
      generate an output signal that is representative of how the magnitude of each voltage associated with each respective current is compared to each other voltage associated with each respective current that is conducted by each respective pair of wires from the second plurality of vertical wires that are coupled to each respective first input and second input of each respective comparator.

3. The analog neuromorphic system of claim 2, further comprising:
   a third plurality of wires positioned to intersect with a fourth plurality of wires forming a second wire grid, wherein each wire from the plurality of wires is coupled to a respective output of each comparator from the first plurality of comparators;
   a second plurality of resistive memories with each resistive memory positioned at an intersection of the third plurality of wires and the fourth plurality of wires and configured to:
      provide a resistance to each input voltage applied to each wire of the third plurality of wires so that each input voltage of the second wire grid is multiplied by the corresponding resistance in addition to the multiplication of each input voltage with the corresponding resistance of the first wire grid,
      add each current of the second wire grid to generate a plurality of accumulative currents with each accumulative current being conducted by each corresponding wire of the fourth plurality of wires in addition to the adding of the first wire grid; and
   a second plurality of comparators with each comparator coupled to a pair of wires from the fourth plurality of wires at a first input and a second input of each comparator from the second plurality of comparators and configured to:
      compare a magnitude of each voltage associated with each respective accumulative current conducted by each respective pair of wires from the fourth plurality of wires that are coupled to each respective first input and second input of each respective comparator from the second plurality of comparators, and
      generate an output signal that is representative of how the magnitude of each voltage associated with each respective accumulated current is compared to each other voltage associated with each respective accumulated current that is conducted by each respective pair of wires from the fourth plurality of wires that are coupled to each respective input and second input of each respective comparator from the second plurality of comparators.

4. The analog neuromorphic system of claim 3, wherein each input voltage applied to each wire of the first plurality of wires drives both the first wire grid and the first plurality of comparators forming a first layer of neurons of a neural network and the output of each comparator from the first plurality of comparators drives both the second wire gird and the second plurality of comparators forming a second layer of neurons from the neural network.

5. The analog neuromorphic system of claim 4, wherein each resistance provided by each resistive memory associated with the first layer of neurons is weighted to determine a functionality of the first layer of neurons and each resistance provided by each resistive memory associated with the second layer of neurons is weighted to determine a functionality of the second layer of neurons.

6. The analog neuromorphic system of claim 5, wherein each resistance provided by a pair of resistive memories generates a single weight for the pair of resistive memories, wherein each pair of resistive memories includes two resistive memories that are positioned on a same wire from the first plurality of wires and/or the third plurality of wires and a same pair of wires from the second plurality of wires and/or the fourth plurality of wires that are coupled to a first output and a second output of a same comparator.

7. A method for generating computation operations in parallel by implementing a plurality of resistive memories, comprising:
    positioning a first plurality of wires to intersect with a second plurality of wires forming a first wire grid;
    providing, by a first plurality of resistive memories with each resistive memory positioned at an intersection of the first plurality of wires and the second plurality of wires, a resistance to each input voltage applied to each of the first plurality of wires so that each input voltage of the first wire grid is multiplied in parallel by the corresponding resistance to generate a corresponding current for each input voltage and each corresponding current is added in parallel; and
    generating at least one output signal from each of the input voltages multiplied in parallel with each of the corresponding currents for each of the input voltages added in parallel, wherein multiplying each input voltage with each corresponding resistance is executed simultaneously with adding each corresponding current for each input voltage.

8. The method of claim 7, further comprising:
    comparing, by a first plurality of comparators with each comparator coupled to a pair of wires from the second plurality of wires at a first input and a second input of each comparator, a magnitude of each voltage that is associated with each respective current conducted by each respective pair of wires from the second plurality of vertical wires that are coupled to each respective first input and second input of each respective comparator; and
    generating an output signal that is representative of how the magnitude of each voltage associated with each respective current is compared to each other voltage associated with each respective current that is conducted by each respective pair of wires from the second plurality of vertical wires that are coupled to each respective first input and second input of each respective comparator.

9. The method of claim 8, further comprising:
    positioning a third plurality of wires to intersect with a fourth plurality of wires forming a second wire grid, wherein each wire from the third plurality of wires is coupled to a respective output of each comparator from the first plurality of comparators;
    providing, by a second plurality of resistive memories with each resistive memory positioned at an intersection of the third plurality of wires and the fourth plurality of wires, a resistance to each input voltage applied to each wire of the third plurality of wires so that each input voltage of the second wire grid is multiplied by the corresponding resistance in addition to the multiplication of each input voltage with the corresponding resistance of the first wire grid;
    adding each current of the second wire grid to generate a plurality of accumulative currents with each accumulative current being conducted by each corresponding wire of the fourth plurality of wires in addition to the adding of the first wire grid;
    comparing, by a second plurality of comparators with each comparator coupled to a pair of wires from the fourth plurality of wires at a first input and a second input of each comparator from the second plurality of comparators, a magnitude of each voltage associated with each respective accumulative current conducted by each respective pair of wires from the fourth plurality of wires that are coupled to each respective input and second input of each respective comparator from the second plurality of comparators; and
    generating an output signal that is representative of how the magnitude of each voltage associated with each respective accumulated current is compared to each other voltage associated with each respective accumulated current that is conducted by each respective pair of wires from the fourth plurality of wires that are coupled to each respective input and second input of each respective comparator from the second plurality of comparators.

10. The method of claim 9, further comprising:
    driving, by each input voltage applied to each wire of the first plurality of wires, both the first wire grid and the first plurality of comparators forming a first layer of neurons of a neural network; and
    driving, by the output of each comparator from the first plurality of comparators, both the second wire grid and the second plurality of comparators forming a second layer of neurons of the neural network.

11. The method of claim 10, further comprising:
    weighting each resistance provided by each resistive memory associated with the first layer of neurons is weighted to determine a functionality of the first layer of neurons; and
    weighting each resistance provided by each resistive memory associated with the second layer of neurons to determine a functionality of the second layer of neurons.

12. The method of claim 11, further comprising:
    generating, by each resistance provided by a pair of resistive memories, a single weight for the pair of resistive memories, wherein each pair of resistive memories includes two resistive memories that are positioned on a same wire from the first plurality of wires and/or the third plurality of wires and a same pair of wires from the second plurality of wires and/or the fourth plurality of wires that are coupled to a first output and a second output of a same comparator.

* * * * *